United States Patent [19]

Suzuki et al.

[11] Patent Number: 5,108,543
[45] Date of Patent: Apr. 28, 1992

[54] METHOD OF SURFACE TREATMENT

[75] Inventors: Keizo Suzuki, Kodaira; Ken Ninomiya, Hachioji; Shigeru Nishimatsu, Kokubunji; Osami Okada, Chofu, all of Japan

[73] Assignee: Hitachi, Ltd., Tokyo, Japan

[21] Appl. No.: 262,266

[22] Filed: Oct. 20, 1988

Related U.S. Application Data

[63] Continuation of Ser. No. 918,505, Oct. 14, 1986, abandoned, which is a continuation-in-part of Ser. No. 795,262, Nov. 5, 1985, abandoned.

[30] Foreign Application Priority Data

| Nov. 7, 1984 | [JP] | Japan | 59-233149 |
| Oct. 14, 1985 | [JP] | Japan | 60-226718 |
| Oct. 14, 1985 | [JP] | Japan | 60-226722 |
| Oct. 25, 1985 | [JP] | Japan | 60-237501 |

[51] Int. Cl.$^5$ ............ B05D 3/06; C23C 16/00; C30B 25/00; B44C 1/22
[52] U.S. Cl. ............ 156/643; 156/646; 156/647; 156/614; 427/255.2; 427/255.3; 427/53.1; 427/38
[58] Field of Search ........ 427/35, 36, 38, 39, 427/53.1, 54.1, 248.1, 255.1, 255.2, 255.3; 156/643, 646, 647, 610, 611, 612, 613, 614

[56] References Cited

U.S. PATENT DOCUMENTS

| 3,460,985 | 8/1969 | Sirtl | 156/612 |
| 4,052,251 | 10/1977 | Weitzel | 156/612 |
| 4,124,466 | 11/1978 | Morrey | 204/157.46 |
| 4,140,905 | 2/1979 | Polanyi | 250/282 |
| 4,323,860 | 4/1982 | Leiby, Jr. et al. | 372/32 |
| 4,409,260 | 10/1983 | Pastor et al. | 427/93 |
| 4,435,447 | 3/1984 | Ito et al. | 427/94 |
| 4,461,686 | 7/1984 | Tuccio et al. | 204/157.41 |
| 4,488,914 | 12/1984 | Quinlan | 156/610 |
| 4,528,211 | 7/1985 | Bhagat | 427/94 |
| 4,529,475 | 7/1985 | Okano et al. | 427/38 |
| 4,549,926 | 10/1985 | Corboy et al. | 156/612 |
| 4,550,047 | 10/1985 | Jackson et al. | 156/610 |
| 4,624,736 | 11/1986 | Gee et al. | 427/54.1 |
| 4,734,158 | 3/1988 | Gillis | 156/646 |
| 4,740,386 | 4/1988 | Cheung | 427/53.1 |

FOREIGN PATENT DOCUMENTS 61-44183 3/1986 Japan.
61-270830 4/1987 Japan.

OTHER PUBLICATIONS

*The Technology and Physics of Molecular Beam Epitaxy*, Ed. Parker Plenum Press, N.Y. 1985.

Primary Examiner—Shrive Beck
Assistant Examiner—Marianne L. Padgett
Attorney, Agent, or Firm—Antonelli, Terry, Stout & Kraus

[57] ABSTRACT

Surface treatment is applied to a substrate by supplying thereto excited molecules in which the vibrational energy level is excited. $SF_6$, $O_2$, $N_2$, etc., are used as the excited molecules and supplied to the substrate as beams. This method is particularly suitable for the surface treatment in the production of semiconductor devices.

12 Claims, 8 Drawing Sheets

METHOD OF SURFACE TREATMENT

This application is a continuation of application Ser. No. 918,505, filed Oct. 14, 1986 now abandoned, which is a continuation-in-part application of application Ser. No. 795,262 filed Nov. 5, 1985 now abandoned.

BACKGROUND OF THE INVENTION

This invention concerns a method of surface treatment capable of attaining a damage- and contamination-free dry process at low temperature, and, particularly, it relates to a method of surface treatment suitable for the production of semiconductor devices and the like.

DESCRIPTION OF THE PRIOR ART

The dry process has generally been used for about 10 years in the field of surface treatment, particularly, in the production of semiconductor devices. The term "dry process" is used to include a process for treating the surface of a substrate under vacuum (including light) or in a gas phase, in contrast to the traditional wet process (using an aqueous solution). In the conventional dry process, however, plasmas or ion beams have been used as the gas phase and the kinetic energy of electrons, ions and ion beams impinging on the surface of the substrate distributes within a range from several eV to $10^4$ eV (refer to FIG. 1). In this way, the displacement energy required for displacing atoms from the correct position in the crystal lattice) Ed is about 10 eV. For instance, the displacement energy for Si crystal is: $Ed = 12.9$ eV (refer to G. Carter and J. S. Colligon, "Ion Bombardment of Solids", Heineman Educational Books Ltd., London, 1968, p 214). In view of the above, damages were inevitably formed on the surface of the substrate in the conventional dry process. Further, due to the impingement of such high energy particles, the temperature of the substrate increased as high as above 300° C. The rise in the temperature of the substrate led to more crystal defects (damages) on the surface of the substrate or extremely restricted the applicable range of the process. Furthermore, if such high energy particles were impinged on the surface near the substrate, they caused physical or chemical sputtering to the surface materials, which were deposited again to the surface of the substrate to cause surface contamination. These damages, contaminations and the temperature rise will be fatal in the technic of surface treatment, particularly in the production technics for semiconductor devices of three-dimensional structure, which are expected to be realized in the near future.

SUMMARY OF THE INVENTION

This invention has been achieved in view of the foregoing and the object of the invention is to provide a method and an apparatus for surface treatment capable of preventing the damage, contamination and temperature rise at the surface to be treated.

According to the present invention, the foregoing object can be attained by conducting the surface treatment by applying thereto those molecules in which a vibrational energy level is excited.

Essential procedures to the dry process include removal of a substance from the surface of the substrate (etching), deposition of a substance on the surface of the substrate (deposition, epitaxy) and modification of the substance at the surface of the substrate (oxidation, nitridation, etc) by using physical or chemical reactions at the surface of the substrate or in the gas phase. In this case, chemical reactions play a more important role than physical reactions, because the former can realize various modes of reactions. The energy relevant to the chemical reactions (chemical bond energy) is distributed within a range from 0.1 to 10 eV and the energy of causing crystal defects is at about 10 eV as shown in FIG. 1. Accordingly, the optimum range for the energy used for performing the dry process is from 0.1 to 10 eV, by which the dry process can be performed without resulting in damage, contamination and temperature rise. As shown in FIG. 1, the vibrational energy level of molecules or electronic energy level of atoms and molecules is suitably used for supplying the energy of from 0.1 eV to 10 eV. However, since the life of the excited electronic energy level is generally short (about $10^{-9}$–$10^{-7}$ sec), it is difficult to supply electronically excited atoms or molecules in a required number for the surface of the substrate. While on the other hand, the life of the vibrational energy level of molecules is in the order of $10^{-2}$ sec and the energy is scarcely lost unless the molecules collide with other atoms, molecules or the surface. Accordingly, it is optimum to use the vibrational energy level of molecules for practicing the dry process. Hereinafter, those molecules in which at least the vibrational energy level is excited (rotational energy level or electric energy level may simultaneously be excited) are referred to as excited molecules.

The excited molecules may be applied to the surface of the substrate to cause chemical reaction, by either a method of using a group of excited molecules having an isotropic velocity distribution as shown in FIG. 2A or a method of using a group of excited molecules having an anisotropic velocity distribution as shown in FIG. 2B (hereinafter referred to as excited molecular beams). Since anisotropic treatment is often demanded for the surface of the substrate (for example, anisotropic etching) generally in the dry process, it is advantageous to use the excited molecular beams. Further, the controllability of the process can also be improved by the use of the excited molecular beams.

DETAILED DESCRIPTION OF THE PREFERRED EMBODIMENT

Figure 1:
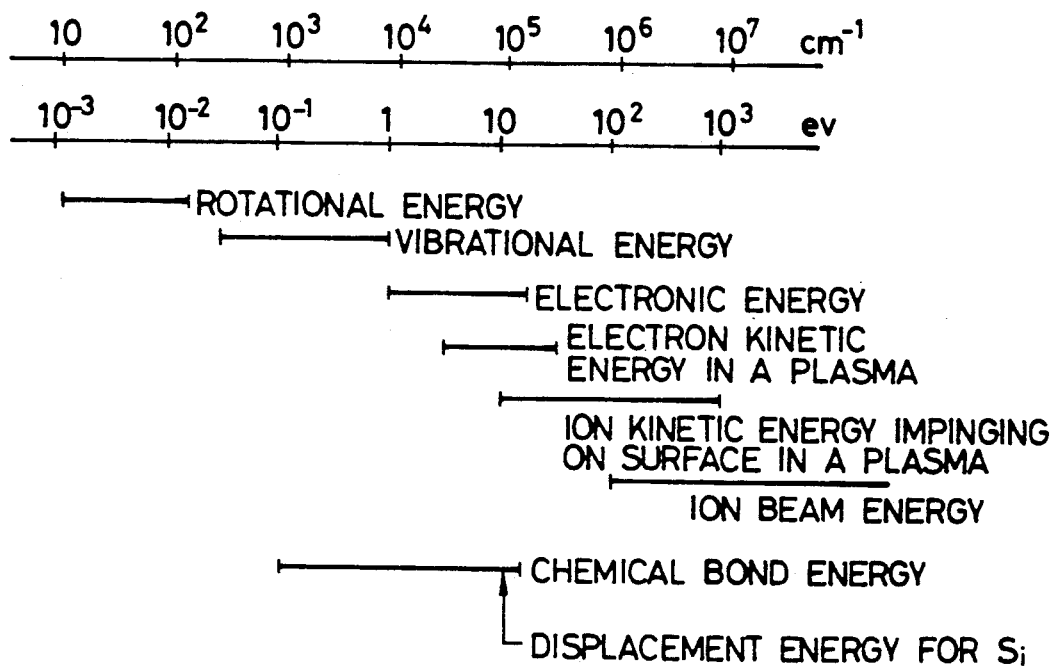
FIG. 1 is an explanatory view showing outlined values for various types of energies.
Figure 2A:
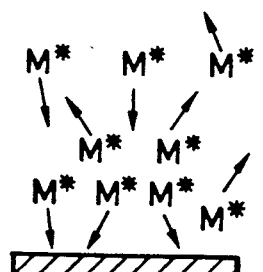
FIG. 2A is an explanatory view for the isotropic velocity distribution of molecules.
Figure 2B:
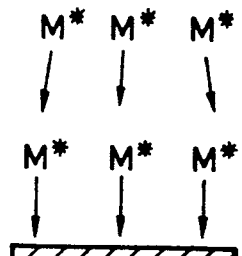
FIG. 2B is an explanatory view for the anisotropic velocity distribution of molecules.

This invention will now be described in greater detail referring to the drawings.

Figure 3:
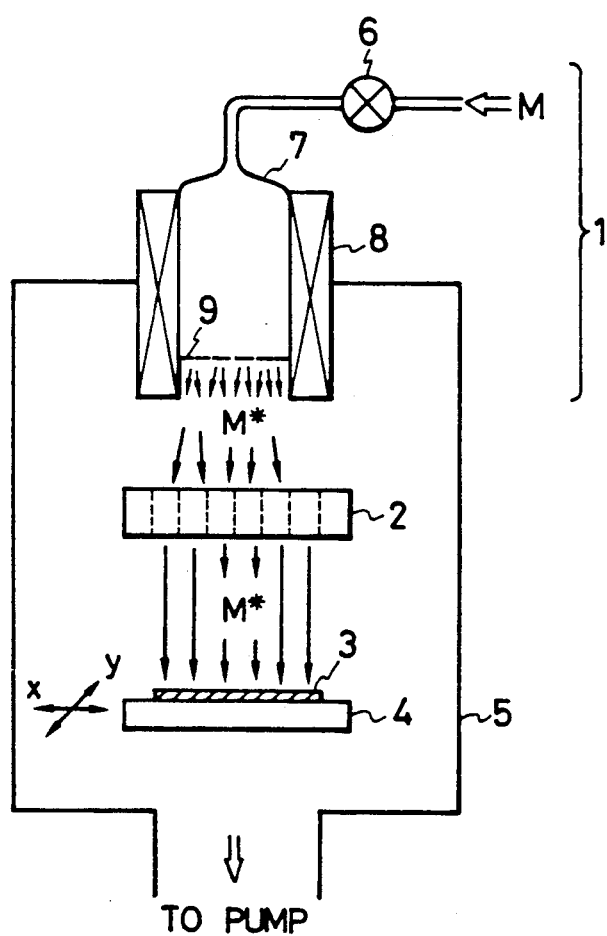
FIG. 3 is a schematic constitutional view of the apparatus for the surface treatment showing one embodiment of the present invention.

FIG. 3 shows one embodiment according to the present invention. The figure illustrates an apparatus for practicing the method of surface treatment, which comprises an excited molecular beam generation means 1, a collimator 2, a substrate 3, a substrate bed 4 and a vacuum chamber 5. The excited molecular beam generation means 1 comprises a gas introduction valve 6, a furnace 7, a heating means 8 and an aperture 9. The excited molecular beam generation means in this embodiment is hereinafter referred to as a heating furnace system. Gas molecules (hereinafter referred to simply as M) introduced from the gas introduction valve 6 into the furnace 7 are heated to a required temperature by a heating means 8 and are excited to the vibrational energy level of the molecules and formed partially into excited molecules (hereinafter referred to as M*). The heating means usable herein include those using electrical resistor, infrared ray lamp, radio frequency induction and the like. The excited molecules are jetted out from an aperture (or apertures) 9 to the inside of a vacuum chamber 5 to form excited molecular beams. The excited molecular beams are further arranged in the velocity component upon passing a collimator 2. The collimator 2 comprises a number of fine apertures perforated in the direction required for passing of the beams. The excited molecular beams passed through the collimator reach the surface of the substrate 3 to perform surface treatment. The substrate 3 is supported on the substrate bed 4. It is possible to dispose a cooling means to the collimator 2 and heating/cooling means to the substrate bed 4. The surface treatment may be conducted without the collimator depending on the circumstances. In this case, although the flux of the excited molecules arriving at the surface of the substrate is increased, and the directionality of the molecular beams is somewhat worsened. Further, in the case of treating a substrate of a large surface area (or treating a plurality of substrates), treatment at a good uniformity can be attained by driving the substrate bed 4 and the substrate 3 relative to the beams.

In the case of etching the surface, for example, of a silicon substrate, it is effective to use $SF_6$ as gaseous molecules to be introduced. The etching mechanism in this case will be explained below.

The $SF_6$ molecules introduced to the inside of the furnace are heated and excited to the molecular vibrational energy level. For instance, when they are heated to 800° C. under the gas pressure of 1 Torr in the reactor, 95% of the $SF_6$ molecules are excited to the vibrational energy level of:

$$Evib \geq 3Ev_3 \qquad (1)$$

where Evib represents the excited energy at the vibrational energy level. The $SF_6$ molecules have six types of fundamental vibrational modes and the excited energy at the vibrational energy level Evib is represented as:

$$Evib = \sum_{i=1}^{6} niEvi \qquad (2)$$

where n1 is a natural integer of 0, 1, 2, 3, ---- and Evi represents a fundamental energy of the $i_{th}$ fundamental molecular vibration mode. Specific values for Evi are: $Ev1 \approx 0.09$ eV, $Ev2 \approx 0.08$ eV, $Ev3 \approx 0.11$ eV, $Ev4 \approx 0.07$ eV, $Ev5 \approx 0.06$ eV, $Ev6 \approx 0.04$ eV. Ev3 is the fundamental energy at the third mode among the six kinds of the basic vibrational modes possessed by $SF_6$, in which $Ev3 \approx 0.11$ eV. Hereinafter, $SF_6$ molecules excited to $Evib \geq 3Ev_3$ are referred to as $SF_6^*$ ($V3 \geq 3$). Further, $SF_6$ at $Evib > 0$ is generally referred to as $SF_6^*$. For heating the $SF_6$ molecules to a required temperature in the furnace (for attaining the thermal balance between the vibrational temperature of the $SF_6$ molecules and the temperature in the furnace), it is effective to set the volume in the furnace to greater than 0.1 cc.

$SF_6^*$ forms $SF_6^*$ beams when jetted out through the fine apertures 9 into vacuum. In order not to lose the vibrational excited energy through the adiabatic expansion upon jetting, it is effective to restrict the diameter of the fine aperture (the minimum length across the opening in the case of a non-circular shape) to about less than 1 mm.

In the collimator 2, a portion of the $SF_6^*$ beams impinges against the inner wall and another portion passes through the collimator with no collision. Since the $SF_6^*$ molecules which impinge against the inner wall loss their vibrational excited energy, the velocity distribution of the $SF_6^*$ beams after passing through the collimator is made more uniform in one direction.

The $SF_6^*$ molecules arriving at the surface of the Si substrate cause a reaction:

$$2SF_6^*(g) + Si(s) \rightarrow SiF_4(g) + 2SF_4(g) \qquad (3)$$

with Si atoms at the surface to conduct etching for the Si surface. In the reaction scheme, (g) and (s) respectively mean that the molecules are present in the gas phase or on the surface of the substrate. The reaction probability of the $SF_6^*$ ($v3 \geq 3$) in the above reaction is about 0.2 (T. J. Chuang, J. Chem. Phys., 74, 1453 (1981), p. 1459).

Figure 4:
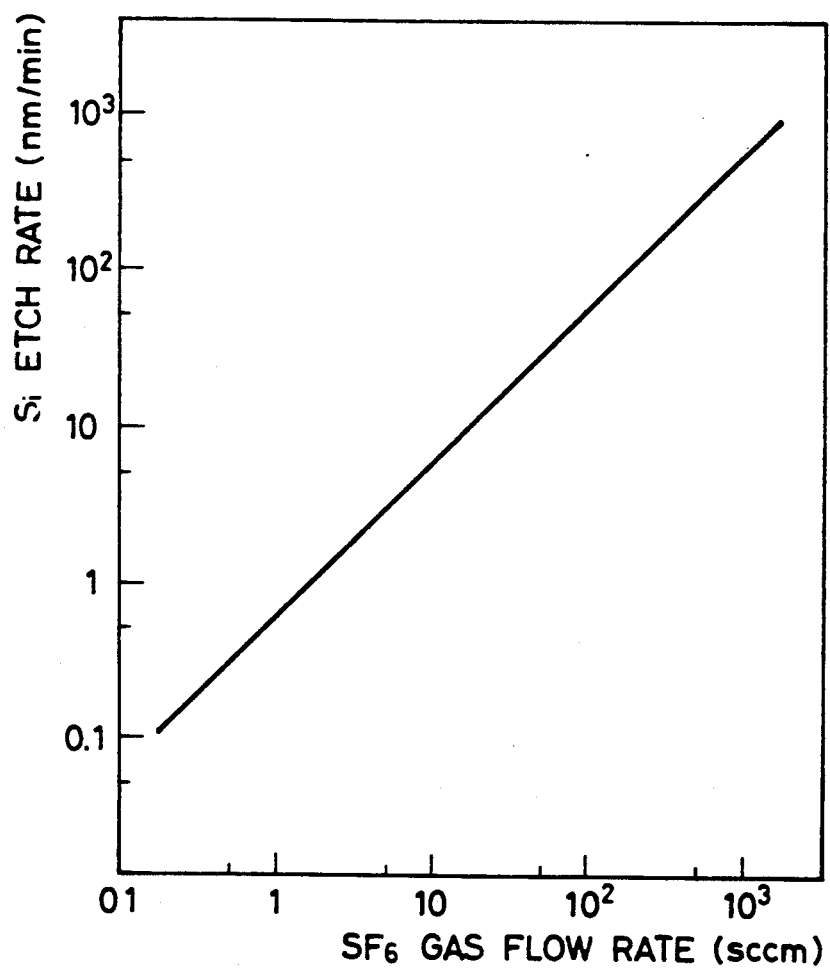
FIG. 4 is a characteristic curve showing the relationship between a Si etching rate and a $SF_6$ gas flow rate in the embodiment shown in FIG. 3.

FIG. 4 shows the relationship between the Si etching rate and the $SF_6$ gas flow rate when conducting Si etching using the apparatus of this embodiment. The etching rate is shown for a Si wafer of 4 inch diameter. As the experimental conditions, the furnace temperature is set to 800° C. and the gas pressure in the furnace is set to 1 Torr. As can be seen from the graph, etching rate is in proportion with the gas flow rate. The etching rate of 57.3 nm/min obtained at the gas flow rate of 100 sccm can satisfy the practical requirements.

Figure 5:
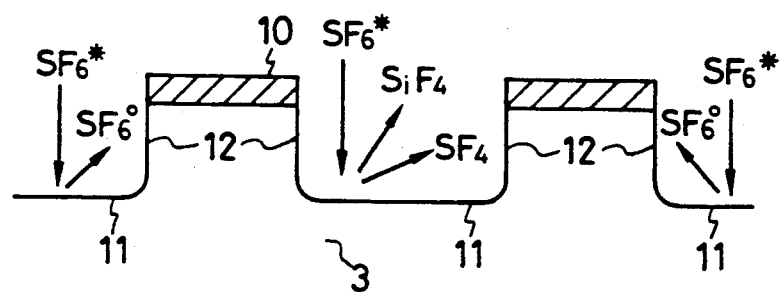
FIG. 5 is an explanatory view showing the etching state in the embodiment shown in FIG. 3.

Anisotropic Si etching (vertical etching), which is essential to the fine fabrication of semiconductors can be attained by the apparatus of the present invention. The mechanism is as shown below (refer to FIG. 5). $SF_6^*$ passing through the collimator 2 impinges vertically to the surface of the substrate 3 etch a portion not covered with a mask 10. As the etching proceeds, $SF_6^*$ reflected at the bottom 11 of the pattern may possibly etch the side face 12 of the pattern. However, $SF_6^*$ reflected on the bottom 11 loses its vibrational energy thereof and is formed into $SF_6$ at the ground state (hereinafter referred to as $SF_6^*$) (J. Misewich, C. N. Plum, G. Blyholder and P. L. Houston, J. Chem. Phys., 78, 4245 (1983)).

$SF_6$. is chemically stable and does not etch Si. Accordingly, it can be found that etching does not proceed to the side face 12. As a result, anisotropic etching (vertical etching) can be realized.

In the case of etching Si by using the apparatus according to this present invention, the energy possessed by the impinging molecules is substantially: $3Ev3 = 0.33$ eV. Since this energy is sufficiently smaller than the displacement energy for Si (12.9 eV), no damages occur at the Si surface. Further, since there occurs no physical sputtering to the substance near the substrate, no contaminations occur at the Si surface. Furthermore, small energy possessed by the impinging molecules means less rise in the temperature at the surface of the substrate. Accordingly, processing at a lower temperature (a temperature substantially equal to room temperature) is possible as compared with the conventional dry process (using plasmas or ion beams).

Although explanation has been made only to the Si etching in this embodiment, this invention is also applicable to the etching for other materials containing Si atoms as the constituent component (polycrystalline silicon, silicon oxide ($SiO_2$), silicon nitride ($Si_3N_4$), silicide (Si-W, Si-Mo, etc)).

In this embodiment, the heating furnace system is employed for forming molecules M* which are vibrationally excited. This method is suitable to forming a great amount of M* in an apparatus of a simple structure.

Figure 6:
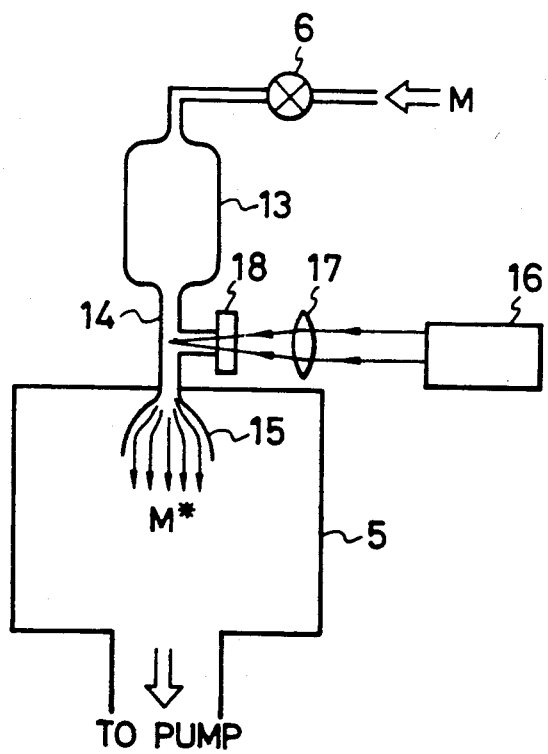
FIG. 6 is a schematic view of the apparatus for surface treatment showing another embodiment of the present invention.

FIG. 6 shows another embodiment of the present invention, that is, a method of obtaining excited molecular beams by using an infrared lasers instead of the heating furnace in the previous embodiment. The apparatus comprises a gas introduction valve 6, a cell 13, a nozzle 14, a jetting port 15, an infrared laser generation means 16, a lens 17, a laser introduction window 18 and a vacuum chamber 5. Molecules M are introduced from the gas introduction valve 6, stored in the cell 13 and then introduced to the nozzle 14. Infrared lasers generated from the infrared laser generation means 16 are passed through the lens 17 and the laser introduction window 18 and then converged to the midpoint of the nozzle 14. A portion of the molecules M within the nozzle is excited to the vibrational energy level by the converged laser into the excited molecules M*, which are jetted out passing through the jetting port 15 to the vacuum chamber 5 to form excited molecular beams. For instance, excited molecular beams of $SF_6$ gas ($SF_6^*$) can be obtained by using $SF_6$ as the molecules M and using the infrared laser of a continuous emitting type having a wavelength at 10.6 μm, a power of 5–10 W and a laser beam cross section of about 20 mm². In order to efficiently introduce the laser beams into the nozzle, ZnSe is suitable as the material for the laser introduction window 18. Further, in order to generate $SF_6^*$ efficiently, the gas pressure in the cell 13 may be set to about 200 Torr. Further, if a mirror finish is applied to the metal inner wall (for example, made of Al) of the nozzle 14, the introduced laser beams conduct multiple reflection (scattering) in the nozzle 14 to efficiently excite $SF_6$. By the use of the method according to this embodiment, excited molecules M* at a high excited energy level (high Evib) can be obtained with ease. However, the apparatus of this embodiment is larger in structure and more expensive as compared with that in the previous embodiment.

Figure 7:
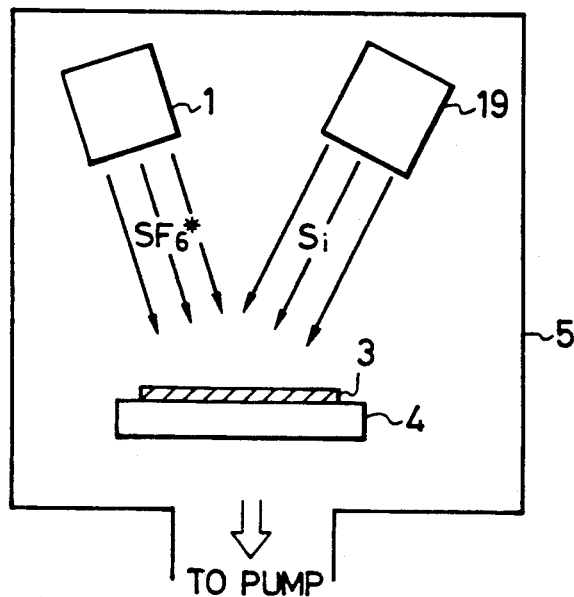
FIG. 7 is an explanatory view for explaining Si epitaxy in a further embodiment of the present invention.
Figure 8:
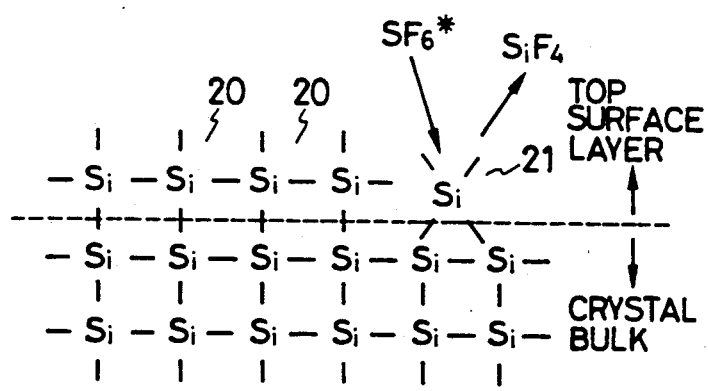
FIG. 8 is an explanatory view for explaining the Si epitaxy state.

FIG. 7 shows another embodiment of the present invention. This embodiment shows the method of performing crystal epitaxy at low temperature. While explanation is to be made for Si (silicon) epitaxy, the method is also applicable to the epitaxy of other crystals. The apparatus of this embodiment comprises an excited molecular beam generation means 1, a Si beam generation means 19, a substrate 3, a substrate bed 4 and a vacuum chamber 5. As the excited molecules for the excited molecular beam generation means 1, those molecules capable of etching Si at a moderate rate, for example, $SF_6^*$ may be used. Further, the substrate bed 4 may be provided with an appropriate heating means. Si atoms or Si molecules ($Si_n$) flying from the Si beam generation means 19 are deposited on the surface of the substrate 3 to grow crystals. FIG. 8 schematically shows the growing step of Si crystals. The portion designated as the crystal bulk shows the side where normal Si crystals have already been formed and the portion designated as the top surface layer shows the side where Si crystals are being formed. Among the Si atoms flying to the surface, a portion is deposited at the correct crystal position (normal position) as shown by Si atoms 20, while another portion is deposited at an incorrect position as shown by the Si atom 21 as in FIG. 8. If the depositing step proceeds in this manner, the crystals are grown not as single crystals but polycrystals. The method of this embodiment enables single crystal growing of only the Si atoms 20 at the correct positions while eliminating (etching) the Si atoms 21 at the incorrect position by using the beams of the excited molecules ($SF_6^*$). The reason why such selective etching depending on the deposition position may be explained as described below. Specifically, the bond energy between the Si atoms at the incorrect positions and the Si atoms on the crystal bulk is smaller than the bond energy between the Si atoms at the correct position and the Si atoms on the crystal bulk. Accordingly, by properly selecting the vibrational energy (Evib) of the excited molecule $SF_6^*$ it is possible to etch only the Si atoms at the incorrect position selectively.

In the conventional Si epitaxy (for example, molecular beam epitaxy (MBE)), single crystal growth has been realized by heating the substrate to a high temperature (600°-800° C.) thereby transferring the Si atoms at the incorrect position to the correct position by means of thermal movement. However, since the processing temperature is so high in this method, the application range is restricted extremely. By the use of the method according to this embodiment, single crystal can be grown at a low temperature (100°-200° C.), thereby providing a broader application range. Particularly, this method is extremely effective for the process of fabricating three-dimensional devices expected to be developed in the near future. While description has been made to epitaxy (single crystal growth) in this embodiment, it is also possible to grow a polycrystalline film having an appropriate grain size by properly selecting the level of the Evib for M*. In this case, the process is directed to the deposition technic.

Figure 9:
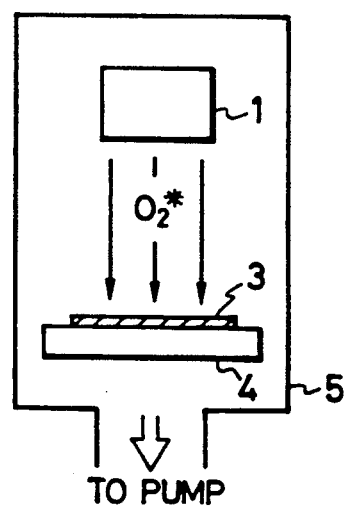
FIG. 9 is an explanatory view for the case of oxidation in still a further embodiment of the present invention.

FIG. 9 show a still further embodiment according to the present invention. This embodiment shows a method of improving the surface by the use of excited molecular beams. Explanation will hereinafter be made to the oxidation of the surface of silicon by using the beams of excited oxygen molecules ($O_2^*$), but the process can also be applicable to other surface modification (for example, nitridation). The apparatus of this embodiment comprises an excited molecular beam generation means 1, a substrate 3, a substrate bed 4 and a vacuum chamber 5. The substrate bed may be provided with an appropriate heating means. $O_2^*$ molecules flying from the excited molecular beam generation means 1 to the surface of the substrate (Si) conduct the oxidation for the surface through the reaction: $Si + O_2^* \rightarrow SiO_2$. The process of this embodiment has an advantageous feature, as compared with the conventional process using $O_2$ plasmas or $O^+$ ion beams, in that the defects at the interface between the $SiO_2$ membrane and Si and within the $SiO_2$ membrane are extremely reduced. Further, no other impurities are incorporated into the $SiO_2$ membrane. In addition, the process temperature can be lowered as compared with that in the conventional process.

Figure 10:
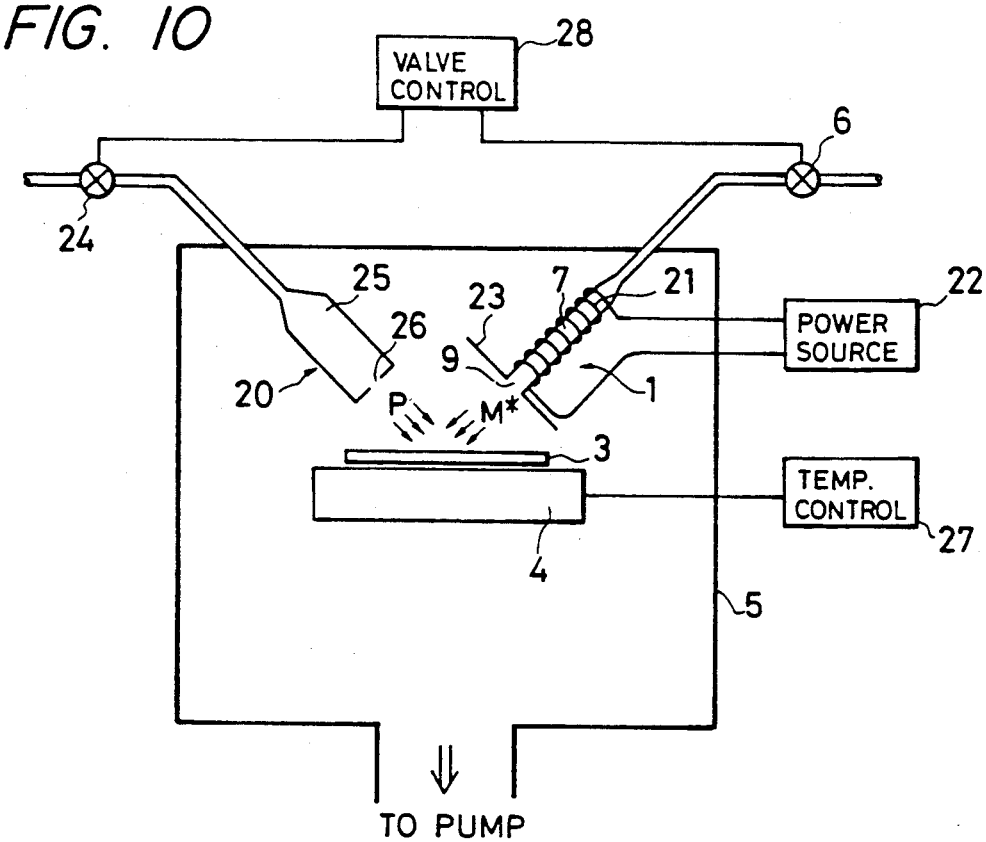
FIG. 10 is a schematic constitutional view of the apparatus for the surface treatment showing a further embodiment of the present invention.

FIG. 10 shows a further embodiment according to this invention. In this embodiment, a vacuum chamber 5 contains an excited molecular beam generation means 1, a reactive particle supply means 20, and a substrate 3 placed on a substrate bed 4. The excited molecular beam generation means 1 comprises a valve 6 for supplying a beam-forming gas, a heating furnace 7 for heating the gas, a heater 21, and a power source 22 for heating. A collar 23 prevents a contaminant from coming flying to the surface of the substrate from the heater 21. Gas molecules M introduced through the valve 6 are heated in the heating furnace 7, and jetted out from a jetting port 9 into vacuum to form vibrationally excited molecular beams (M* beams). The jetting port 9 is not always necessary, and there are cases where an opening having the same diameter as the inner diameter of the heating furnace 5 will suffice. The reactive particle supply means 20 comprises a valve 24 for supplying reactive particles (P), a gas reservoir 25, and a jetting port 26. The reactive particle (P) gas introduced through the valve 24 is adjusted to uniformly flow in the gas reservoir 25, and jetted out from the jetting port 26 into vacuum to form reactive particle beams. The reactive particles are not always fed in the form of beams to the surface of the substrate, and may be supplied in the form of an atmospheric gas having an isotropic velocity distribution in the vicinity of the substrate 3. The substrate 3 is placed on the substrate bed 4. If desired, a temperature control means 27 for controlling the substrate temperature may be provided. A substrate having a large area can be uniformly surface-treated by driving the substrate bed 4 and the substrate 3.

Description of the etching mechanism will now be given to a case where $CO_2$ and $F_2$ are used as the molecules M forming excited molecules and the reactive particles P, respectively, while Si (single crystal, polycrystalline, or amorphous) is used as the substrate (substance to be etched). When $F_2$ is impinged against the surface of Si, $F_2$ is bonded to Si via non-bonded bonds thereof to form $SiF_2$. Specifically, the following reaction occurs:

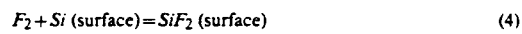
$$F_2 + Si \text{ (surface)} = SiF_2 \text{ (surface)} \tag{4}$$

When excited $CO_2$ molecules ($CO_2^*$) are impinged against the surface, the following reaction is promoted by the vibrational energy of molecules:

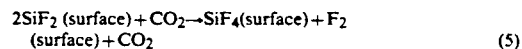
$$2SiF_2 \text{ (surface)} + CO_2 \rightarrow SiF_4 \text{(surface)} + F_2 \text{ (surface)} + CO_2 \tag{5}$$

Figure 11:
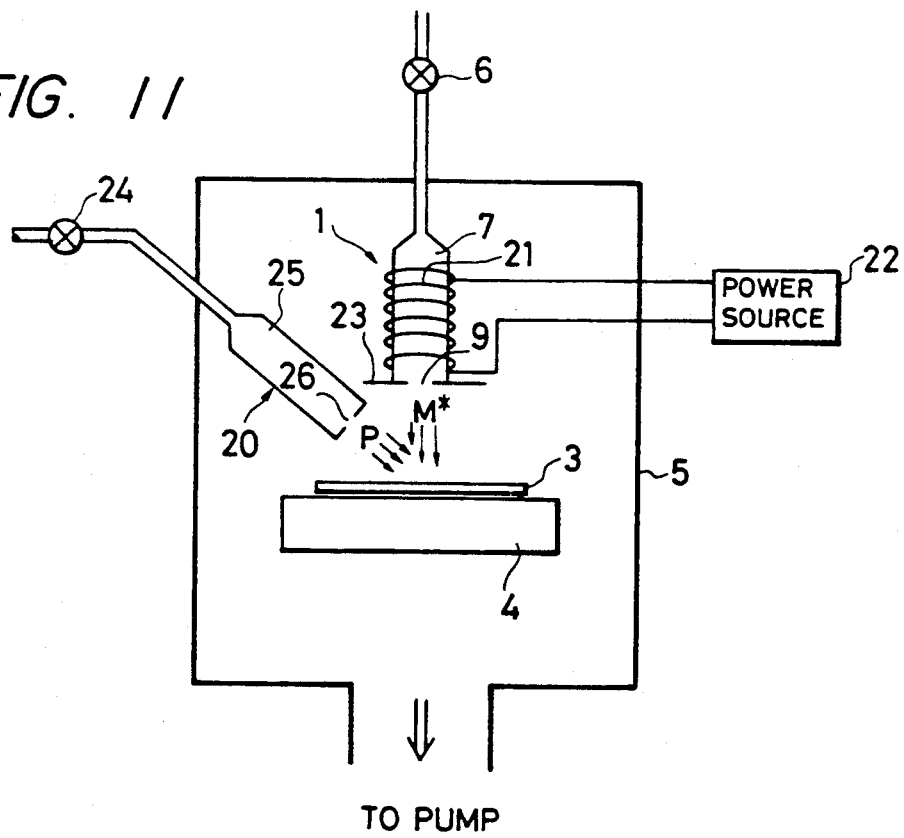
FIG. 11 is a constitutional view of the apparatus for the surface treatment showing a further embodiment of the present invention.

$SiF_4$ (surface) as the reaction product is released (evaporated) from the surface to allow etching to proceed. In this method, when $CO_2^*$ is reflected on the surface of Si, $CO_2^*$ loses the vibrational energy to become $CO_2$ in the ground state. Therefore, there is no probability of etching of the side walls of a pattern with reflected $CO_2^*$. Thus, vertical etching with $CO_2^*$ beams can be effected. In this case, however, the incident direction of the $CO_2^*$ beams is towards the surface, and accordingly the perpendicular direction of the jetting port 9 of the furnace, must be set perpendicular to the surface of the substrate. This situation is shown in FIG. 11. The higher the gas flow rate of $CO_2$, the higher the rate of the treatment can be. The practical gas flow rate is 0.1 to 100 sccm when consideration is given to a gas discharging system. The temperature in the furnace is suitably 800° to 1,500° C., while the gas pressure is suitably 0.1 to 10 Torr. The diameter of the jetting port 9 is suitably 0.1 to 10 mm. A heat resistance and a corrosion resistance are required of the material of the furnace. Quartz and alumina are suitable as the furnace material. The flow rate of $F_2$ is determined by the gas discharging capacity, and is suitably 0.1 to 100 sccm.

The reason for using $CO_2$ as the molecules M is that the bonding force between atoms constituting a $CO_2$ molecule is strong and chemically stable enough for the $CO_2$ to be hardly decomposed even when heated at high temperatures. $CF_4$, $SF_6$, $SiF_4$, etc. can be used as the molecules M in addition to $CO_2$. On the other hand, the reason for using $F_2$ as the reactive particles P is that $F_2$ does not etch Si by itself, but easily dissociates on the surface in the presence of excited molecular beams to form F radicals which etches Si. $Cl_2$, $NF_3$, $C_nF_m$, $XeF_2$, etc. can be used as the reactive particles P in addition to $F_2$. In addition to Si, other substrates such as metals including Mo, W, Ta, Co, and Nb; and silicides of such metals can perform etching when the kinds of molecules M and reactive particles P are adequately chosen.

When opening and closing of gas introduction valves 6 and 24 are controlled by a valve timing controller 28 in accordance with a predetermined program as shown in FIG. 10, the following effect can be attained. In this case, since gas supply towards a surface of the substrate can be intermittently done, a large amount of gas flow can be instantaneously impinged against the surface of the substrate with an apparatus with a given gas discharging capacity. Further, the gas molecules M and the reactive particles P can be alternately impinged to alternately effect the reactions (4) and (5), so that highly accurate etching can be effected.

Although the present invention has hereinbefore been illustrated with reference to the case of etching, the present invention can also be utilized in deposition. When, for example, $CO_2$ and $SiH_4$ are used as the gas molecules M and the reactive particles P, respectively, $SiH_4$ is decomposed by the vibrational energy of excited $CO_2$ ($CO_2^*$) to allow the following reaction to proceed:

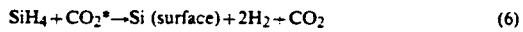

$$SiH_4 + CO_2^* \rightarrow Si\,(surface) + 2H_2 + CO_2 \qquad (6)$$

The reaction product Si (amorphous, polycrystalline, single crystal) is accumulated on the surface to effect desposition.

In the embodiment as shown in FIGS. 10 and 11, excited molecules (M*) are formed by heating the furnace with a heater. Alternatively, excited molecules (M*) are formed by heating gas molecules M with an infrared laser, an infrared lamp, or RF heating.

Figure 12:
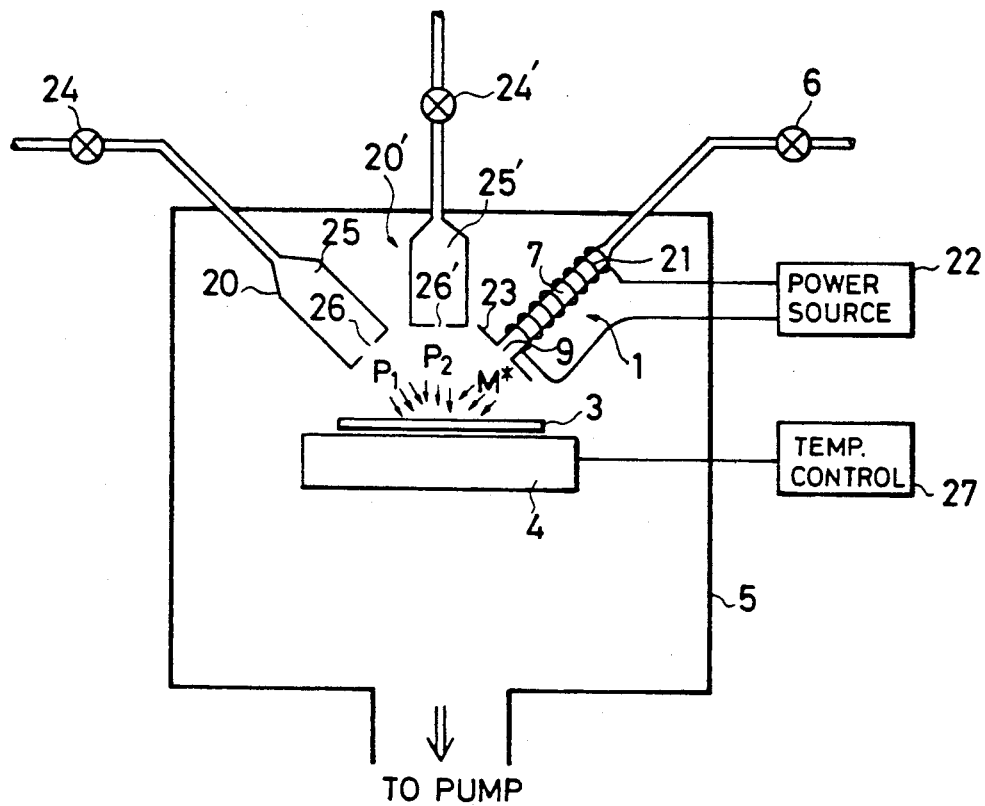
FIG. 12 is a constitutional view of the apparatus for the surface treatment showing a further embodiment of the present invention.

FIG. 12 shows a further example of this invention. A difference of FIG. 12 from FIG. 10 is that there are provided a plurality of reactive particle supply means 20 and 20' consisting of valves 24 and 24', gas reservoirs 25 and 25', and jetting ports 26 and 26'. In accordance with the method of this embodiment, deposition of, for example, an oxide film can be effected. Specifically, in this case, $CO_2$, $SiH_4$, and $O_2$ are used as gas molecules M, reactive particles $P_1$, and reactive particles $P_2$, respectively. In this case, the following reaction occurs in the wake of the above-mentioned reaction (6):

$$Si\,(surface) + O_2 \rightarrow SiO_2\,(surface) \qquad (7).$$

Thus, an oxide film is formed on the surface, the use of $N_2$ instead of $O_2$ can perform deposition of a nitride film ($Si_3N_4$).

Figure 13:
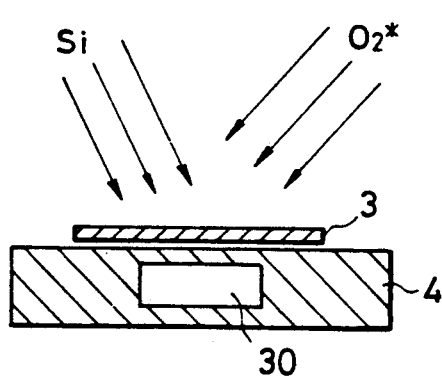
FIG. 13 is an explanatory view for explaining the method for formation of a compound film according to a further embodiment of the present invention.

A further embodiment of the present invention will now be described with reference to FIG. 13. In this embodiment, a substrate 3 and a substrate bed 4 are in vacuum. Beams of Si particles (Si atoms, Si molecules, or Si clusters) and beams of excited $O_2$ molecules in which the molecular vibrational level is excited are impinged against a surface of the substrate 1. If desired, the substrate bed 4 is provided with a substrate heating means 30. Si beam particles and excited $O_2$ beam particles are bonded to each other on or near the surface of the substrate to form an $SiO_2$ film on the surface of the substrate. Since beams of excited $O_2$ molecules are used, bonds of $SiO_2$ are easily formed, leading to an $SiO_2$ film of good quality. Beams of molecules containing an Si atom (e.g., $SiH_4$ or $SiF_4$) may be used instead of Si particle beams. When, for example, $SiH_4$ beams and excited $O_2$ beams are used, the following reaction occurs:

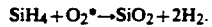

$$SiH_4 + O_2^* \rightarrow SiO_2 + 2H_2.$$

Although formation of a silicon oxide film ($SiO_2$ film) has hereinbefore been described, a silicon nitride film ($Si_3N_4$ film) can be formed when excited $N_2$ ($N_2^*$) beams are used instead of excited $O_2$ ($O_2^*$) beams. When beams of Al, W, Ti, Mo, Ta, or analogous particles are used instead of Si particle beams, an oxide or nitride film of Al, W, Ti, Mo, Ta, or analogous substance can be formed.

Since chemical bonds (e.g., Si-O) are sequentially formed during the course of film formation in the method of the present invention, there is no necessity for heating the substrate to a high temperature.

Figure 14:
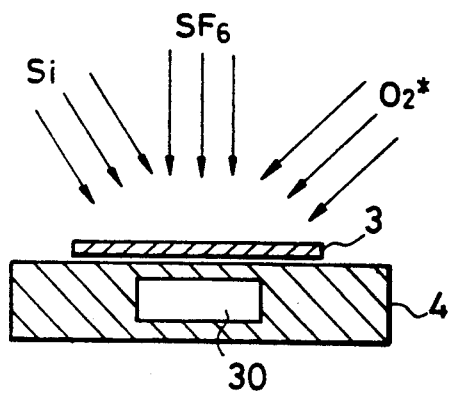
FIG. 14 is an explanatory view for explaining the method for formation of a compound film according to a further embodiment of the present invention.

FIG. 14 shows a further embodiment of the present invention. A difference of FIG. 14 from FIG. 13 is that beams of $SF_6$ molecules or excited $SF_6$ molecules ($SF_6^*$) is further added. The reason for this is as follows. Si atoms which have not reacted with $O_2$ react with $SF_6$ molecules according to the following formula:

$$Si + 2SF_6 \rightarrow SiF_4 \uparrow + 2SF_4.$$

Thus, excess Si atoms are removed, so that an $SiO_2$ film of good quality can be formed. When excited $SF_6$ molecule ($SF_6^*$) beams are used instead of $SF_6$ molecule beams, removal of excess Si atoms is more efficiently effected. When beams of molecules containing a halogen element such as $F_2$, $Cl_2$, or $NF_3$ (or excited molecules thereof) are used instead of $SF_6$ molecules (or excited $SF_6$ molecules), the same effect can be attained.

A further embodiment of the present invention will now be described with reference to FIG. 15.

This embodiment is concerned with utilization of an interaction between excited molecules and ions. As shown in the figure, an Si substrate 34 is placed on a substrate bed 36 disposed in a reaction chamber 33. Sulfur hexafluoride ($SF_6$) is released from a gas bomb 32 containing $SF_6$, and is converted into excited molecules in an excited molecule source 40. The excited molecules flow into the reaction chamber 33. This alone does not allow the Si substrate 34 to be etched at all. When the substrate is irradiated with an ionic shower 35 of argon ions ($Ar^+$) coming from an ion source 31 with an energy of about 100 eV at a current density of 0.8 mA/cm², however, an etching rate of about 300 nm/min is attained. This value is larger by about one figure than that in physical sputtering etching with an ionic shower alone.

Figure 16:
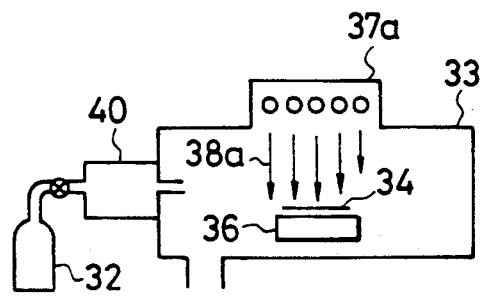
FIG. 16 is a schematic constitutional view of the apparatus for the surface treatment showing a further embodiment of the present invention.

A case of utilizing an interaction between excited molecules and light will now be described with reference to FIG. 16. An $N_2$ gas is released from a gas bomb 32 containing nitrogen ($N_2$), and is converted into excited molecules in an excited molecule source 40, followed by flowing the excited molecules into a reaction chamber 33. A substrate 34 disposed in the reaction chamber 33 is irradiated with ultraviolet rays 38a emitted from an ultraviolet ray source 37a constituted of a high pressure mercury lamp. In this way, the Si of the substrate 34 can be nitrided. The resulting nitride film is thicker than that formed by a mere combination of an $N_2$ gas and ultraviolet ray irradiation.

Additionally, in the case of nitriding, use of nitrogen radicals in addition to excited molecules is more effective.

Figure 17:
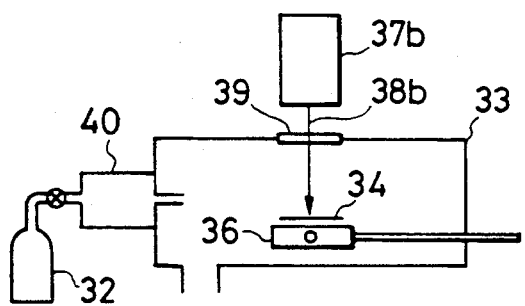
FIG. 17 is a schematic constitutional view of the apparatus for the surface treatment showing a further embodiment of the present invention.

A case of utilizing an interaction between excited molecules and light beams is shown in FIG. 17. A chlorinated gas (e.g., $Cl_2$) coming out of a gas bomb 32 is converted into excited molecules in an excited molecule source 40, while a substrate 34 is irradiated with ultraviolet beams 38b emitted from a laser beam source 37b. In this way, chip separation of GaAs IC as a substrate 34 is effected when a substrate bed 36 is moved in the direction XY. Additionally stated, movement of the beams or the substrate is merely relative. Thus, movement of beams instead of that of the substrate can provide the same effect of causing a reation only in a portion irradiated with beams. The reaction of the substrate with excited molecules is very slow in the portions other than the portion irradiated with beams.

When converged ion beams of Ga are used instead of laser beams, further higher speed etching is possible.

In the case of forming Ga As chips, better results are obtained by increasing the temperature of a substrate bed 36 around 200° C. to heat a substrate 34.

Figure 18:
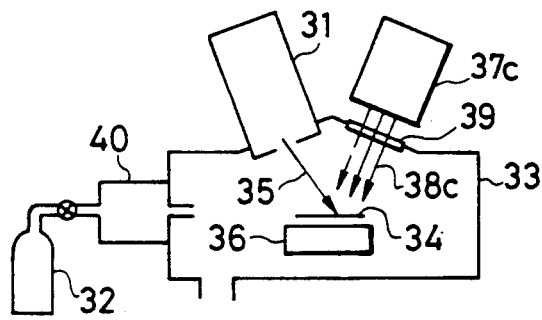
FIG. 18 is a schematic constitutional view of the apparatus for the surface treatment showing a further embodiment of the present invention.
Figure 19:
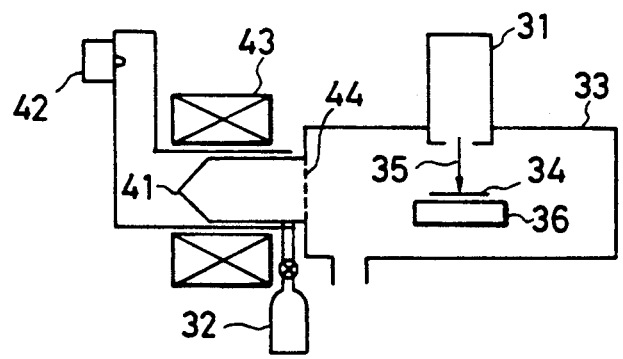
FIG. 19 is a schematic constitutional view of the apparatus for the surface treatment showing a further embodiment of the present invention.

Instead of heating the substrate bed 36 in order to heat the substrate 34, the same result can be obtained by irradiating the substrate 34 with infrared rays 38c from an infrared ray source 37c as shown in FIG. 18.

Where radicals and excited molecules are allowed to coexist, an excited molecule source 10 as hereinbefore mentioned may be of a magnetic field microwave discharge type as shown in FIG. 19. In the figure, the numerals 41, 42, and 43 refer to an insulated branch discharge tube, a magnetron, and an electromagnetic coil, respectively. In order to eliminate the influence of ions, a porous plate 44 is provided to partition a discharge part and a reaction chamber 33.

GaAs can also be etched by using electron beams instead of converged ion beams. Since relatively low speed electron beams can be position-controlled, an interaction between excited molecules and low speed electron beams (with an acceleration voltage of several hundreds of volts) is effective in local etching or deposition of semiconductors. This method is expected to be effective in production of three-dimensional elements in the future if the surface treatment can be done with only a little damage.

As described in connection with various embodiments, the characteristic features of the present invention consists in effectiveness not only in the case where etching cannot be effected with only excited molecules (position control is possible) but also in the case where etching does not proceed even if radicals coexist with excited molecules. In the latter case, the effectiveness is attained by utilizing an interaction between a combination of coexisting excited molecules and radical, and light, electrons, or ions.

Figure 15:
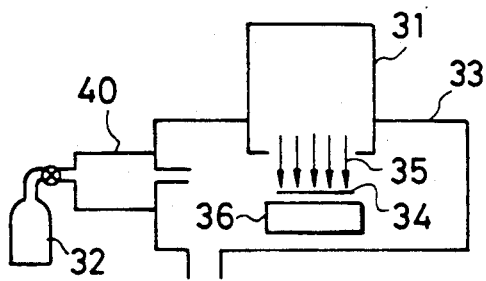
FIG. 15 is a schematic constitutional view of the apparatus for the surface treatment showing a further embodiment of the present invention.

In the embodiment as shown in FIG. 15, it is also conceivable that film formation or etching on a substrate or in the vicinity thereof can be effected by irradiating the substrate with light having a wavelength above the upper limit of wavelength in light absorption of raw material gases.

The surface treatment as referred to in the present invention is not limited to etching, deposition (film formation), and nitriding, but includes oxidation, surface modification by a combination thereof with ion implantation or the like, and cleaning. As for materials to be treated, in addition to semiconductor materials such as Si and GaAs, metals, insulating materials, etc. can be effectively surface-treated.

The interaction between excited molecules and light, electrons, or ions is not necessarily direct. Specifically, the substrate may be irradiated with excited molecules, light, etc. in a time division mode to cause a reaction on the surface thereof. Alternately, the amounts of excited molecules, light, etc. supplied may be constant with time or may be changed periodically.

Since damages of a substrate may be caused by light, electrons, or ions, caution must be taken to suppress the energy thereof to a low level within a necessary and sufficient range.

According to the present invention, the surface chemical reactions can proceed with a small amount of required energy. As a result, the surface treatment at low temperature free from damages and contaminations can be attained. This processing technic is extremely effective to the production field of semiconductor devices or the like and, particularly, to the production of semiconductor devices of three-dimensional structure, which are expected to be developed in the near future.

What is claimed is:

1. A method of etching treatment, wherein etching treatment is applied to a surface of a substrate placed in a vacuum chamber, and wherein the etching treatment is carried out via chemical reaction on said surface by supplying a beam of excited molecules to said surface, the excited molecules being raised to be within at least one vibrational energy level such that said excited molecules within said beam cause chemical reaction; said etching treatment being capable of avoiding damage to the surface.

2. The method of etching treatment as defined in claim 1, wherein the beam of excited molecules is supplied to the surface together with growth atoms or growth molecules to be grown as crystals on the surface of the substrate, and wherein the vibrational energy level of said excited molecules within said beam is selected so as to etch said growth atoms or growth molecules which are grown at undesired crystal portions, but to leave said growth atoms or growth molecules which are grown at correct crystal portions.

3. The method of etching treatment as defined in claim 1, wherein the excited molecules are selected from the group consisting of $SF_6$, $SiF_4$, $F_2$, $Cl_2$, $NF_3$, and $XeF_2$.

4. The method of etching treatment as defined in claim 1, wherein the excited molecules are $O_2$.

5. The method of etching treatment as defined in claim 1, wherein the excited molecules are $N_2$.

6. The method of etching treatment as defined in claim 1, wherein the excited molecules are prepared by heating molecules in a heating furnace.

7. The method of etching treatment as defined in claim 1, wherein the excited molecules are prepared by heating the molecules by means of a laser.

8. A method of etching treatment according to claim 1, wherein the excited molecules are collimated before being supplied to the substrate.

9. A method of etching treatment, wherein etching treatment is applied to a surface of a substrate placed in a vacuum chamber, and wherein said etching treatment is carried out via chemical reaction on said surface by irradiating said substrate with a plurality of kinds of particles, at least one of which is a beam of excited molecules, the excited molecules being raised to be within at least one vibrational energy level such that said excited molecules within said beam cause chemical reaction; said etching treatment being capable of avoiding damage to the surface.

10. A method of etching treatment comprising:
supporting a substrate in a vacuum chamber;
heating molecules introduced in a heating furnace to raise the molecules to at least one vibrational energy level; and
supplying the molecules as a beam from the heating furnace to the substrate of which a surface is to be treated so as to etch the surface via chemical reaction; said etching treatment being capable of avoiding damage to the surface.

11. A method of etching treatment according to claim 10, wherein the excited molecules are collimated before supplying to the substrate.

12. A method of etching treatment comprising:

supporting a substrate of which a surface is to be treated within a vacuum chamber;

providing a molecular beam generator in communication with said vacuum chamber;

supplying gas molecules to said molecular beam generator;

heating said gas molecules to raise the gas molecules to at least one vibrational energy level;

passing said gas molecules through a collimator located between said vacuum chamber and said molecular beam generator, to form beams of excited molecules;

irradiating said surface of said substrate with said molecular beam, to cause chemical reaction on the surface; and etching said surface of said substrate by said chemical reaction; said etching treatment being capable of avoiding damage to the surface.

* * * * *